United States Patent [19]

Meyer et al.

[11] Patent Number: 5,089,880
[45] Date of Patent: Feb. 18, 1992

[54] PRESSURIZED INTERCONNECTION SYSTEM FOR SEMICONDUCTOR CHIPS

[75] Inventors: James A. Meyer, Campbell; Frank Mikalauskas, San Jose; Howard L. Parks, Los Gatos, all of Calif.

[73] Assignee: Amdahl Corporation, Sunnyvale, Calif.

[21] Appl. No.: 362,822

[22] Filed: Jun. 7, 1989

[51] Int. Cl.$^5$ .......................................... H01L 23/16
[52] U.S. Cl. ........................................ 357/75; 357/79; 361/414
[58] Field of Search ................... 357/75, 79, 74, 80; 361/403, 414, 415, 412

[56] References Cited

U.S. PATENT DOCUMENTS

| | | | |
|---|---|---|---|
| 3,705,332 | 12/1972 | Parks | 29/625 |
| 3,769,702 | 11/1973 | Scarbrough | 29/627 |
| 3,775,844 | 12/1973 | Parks | 29/626 |
| 3,813,773 | 6/1974 | Parks | 29/630 R |
| 4,202,007 | 5/1980 | Dougherty et al. | 357/80 |
| 4,221,047 | 9/1980 | Narken et al. | 357/75 |
| 4,249,302 | 2/1981 | Crepeau | 29/830 |
| 4,275,410 | 6/1981 | Grinberg et al. | 357/45 |
| 4,283,754 | 8/1981 | Parks | 361/382 |
| 4,322,778 | 3/1982 | Barbour et al. | 357/74 |
| 4,407,007 | 9/1983 | Desai et al. | 357/74 |
| 4,667,219 | 5/1987 | Lee et al. | 357/74 |

FOREIGN PATENT DOCUMENTS

| | | | |
|---|---|---|---|
| 3233195 | 3/1983 | Fed. Rep. of Germany | 357/75 |
| 0133744 | 6/1987 | Japan | 357/74 |
| 0069258 | 3/1988 | Japan | 357/74 |
| 0156348 | 6/1988 | Japan | 357/75 |
| 0252456 | 10/1988 | Japan | 357/81 |

Primary Examiner—Rolf Hille
Assistant Examiner—Hoanganh Le
Attorney, Agent, or Firm—Fliesler, Dubb, Meyer & Lovejoy

[57] ABSTRACT

A multilayer pressure stack (microstack) has a plurality of layers formed of a material that may have a high time-dependent deformation factor and a plurality of segments formed in each layer. Each segment comprises a conductive material having a low time-dependent deformation factor and pressure is provided along a column of aligned segments to establish electrical interconnections between the segments in various layers. Interposers formed of non-conductive material may be provided in selected segments to form points of electrical isolation. The plurality of layers, or wafers, includes signal wafers and ground/voltage wafers. The signal wafers are formed of a low dielectric constant material to optimize the propagation velocity of signals traveling in signal traces connecting selected segments in the signal wafer. More than 100 wafers may be provided in a microstack and repairs and revisions of conductor routing are easily accomplished by substituting new wafers within the microstack.

26 Claims, 6 Drawing Sheets

FIG.—1

PRESSURIZED INTERCONNECTION SYSTEM FOR SEMICONDUCTOR CHIPS

BACKGROUND OF THE INVENTION

1. Field of the Invention

The present invention relates to an interconnect system for electrical devices; more particularly, to a pressure activated package for housing semiconductor chips in a two-dimensional array and providing electrical interconnections between the chips.

2. Description of the Related Art

The time required for an electrical pulse to travel along a conductor from one active electrical device to another is one of the factors which determines the performance of an electronic package (or assembly). The factors which determine this time are (1) the physical distance between the devices and (2) the propagation velocity of the pulse. One parameter which affects the propagation velocity is the dielectric constant of the materials used to support the conductor. As an example and to provide a basis for comparison, the signal propagation velocity for conventional printed circuit boards is on the order of 50-60% of the speed of light (c).

In the prior art, each of the above issues has been addressed by utilizing increasingly complex multilayer printed wiring boards. To accommodate the device density requirements of system designers, via holes have become smaller and closer together, interstitial vias have been developed for selective connection of layers, conductor lines have become narrower and closer together, the number of conductive layers in the printed wiring boards has been increased, and alternative materials having reduced dielectric constants have been developed and utilized. Physical limits are being approached for each of the foregoing parameters, which create the need for improved packages and packaging technology.

Further, indigenous to printed wiring board technology is the dedicated routing of conductor paths in complex assemblies. Revisions to the routing for repair or re-design purposes are accomplished with great difficulty, usually involving the physical cutting of the conductor to be re-routed and connecting a wire to the new termination points.

Two different types of packages (or interconnect systems) have been used to provide connections between the various chips in a package, so-called "two-dimensional packages" and "three-dimensional packages." In a two-dimensional package, the package includes an interconnect structure having plural leads passing in the x, y and z directions within the interconnect structure for electrically interconnecting semiconductor chips provided on the exterior of the interconnect structure. Such a package usually comprises a plurality of wafers provided in a stack with x and y interconnects on the surface of or contained in the wafers and z interconnects passing through the wafers.

As used herein, the term "package(s)" refers to devices for housing and/or interconnecting plural electrical devices, particularly, semiconductor chips, and the alternative terms "chip(s)", "semiconductor chip(s)", and "semiconductor device(s)" refer to an encapsulated die having bonding pads provided thereon.

An example of a two-dimensional package is illustrated in U.S. Pat. No. 3,705,332. An example of a three-dimensional package is disclosed in U.S. Pat. No. 3,769,702. Other U.S. Patents pertaining to packages for semiconductor chips include U.S. Pat. No. 3,775,844; U.S. Pat. No. 3,813,773; U.S. Pat. No. 3,917,983; U.S. Pat. No. 4,268,956; and U.S. Pat. No. 4,283,754.

High-density multilayer printed wiring boards using through-hole technology for assembling electrical devices, and extra-high-density multilayers that are suitable for surface mounting of electrical devices have been developed to provide increasingly smaller spacings between devices and increasingly larger pin densities and counts per device. Each offers the following features: (1) Modularized packaging—electrical devices may be architecturally grouped according to function and located on one multilayer printed wiring board; (2) Mass assembly—printed wiring boards may be batch assembled and mass-soldered to achieve economic advantages; (3) Serviceability—repairs to large systems may be easily accomplished by removing and replacing modules which fail in service; and (4) Reliability—the in-service failure rate of multilayer printed wiring boards is significantly less than that of other components in the system.

The continuing trend toward greater integration of electrical devices on one interconnection mechanism, and the value of increased pulse propagation velocity have caused many features of conventional multilayer printed wiring boards to approach physical limits. For example, it is impractical to drill large quantities of high-aspect-ratio holes (holes having a large length-to-diameter ratio) less than approximately 0.011" in diameter; it is extremely difficult to metallize through-via holes having aspect ratios greater than approximately 8:1; it is extremely difficult to register and laminate greater than approximately 30 conductive layers; and it is extremely difficult to process low dielectric constant materials into high layer count multilayers. Each of the foregoing difficulties contributes significantly to the cost of the product. When two or more difficulties are faced in fabricating one part, the costs can escalate geometrically as the manufacturing yields approach zero.

EXAMPLES OF CONVENTIONAL PACKAGING SYSTEMS

Parks in U.S. Pat. No. 4,095,867 describes a pressurized interconnection scheme which uses substantially metallic wafers suitable for assembling a pair of flat-pack devices with a pressure cap.

U.S. Pat. No. 4,184,729, issued to Parks et al. describes a pressurized structure for creating an electrical contact between a flexible cable and two planar circuit boards or a single planar circuit board by applying pressure.

An alternative to the conventional drill-and-plate technology for forming surface-to-surface connections in a wafer was described by Meyer et al. in U.S. Pat. No. 4,239,312, and by Grinberg et al. in U.S. Pat. No. 4,275,410. Conductive pathways were formed through ceramic materials by generating a thermal gradient through the ceramic material and causing a droplet of liquid aluminum to migrate along the gradient, leaving a conductive pathway in its wake. Electrical connections between layers were accomplished by spring-loaded conductors which elastically deformed under mechanical load. This concept uses materials having high dielectric constants and materials having a large resistance, e.g., aluminum, and is limited in density of layer-to-layer interconnections by the use of the spring-loaded conductors.

U.S. Pat. No. 4,240,198, issued to Alonso, describes the use of a conductive elastomer in the formation of electrical connections through a layer composed of metal. The intended application of the disclosed structure was in high-density connectors.

U.S. Pat. No. 4,499,655, issued to describes the formation of a segment in a silicon-on-sapphire composite substrate which has solder as its major constituent. The solder segments in one layer are coarsely aligned with solder segments in adjacent layers, and the assembly is then fused together at high temperature to achieve precise alignment of the layers. Clearly, pulse propagation velocity was not a consideration in this design.

A pressurized system for electrically connecting two surfaces of adjacent elements is described by Cuneo et al. in U.S. Pat. No. 4,466,184. The structure disclosed makes no provision for electrically interconnecting conductors on opposed surfaces of the same layer (wafer). Further, the interlayer contact system must be formed separately from stock metal and then mechanically inserted between the surfaces to be connected.

U.S. Pat. No. 4,249,302, issued to Crepeau, discloses a multi-layer printed circuit board having a pattern of pads formed in each layer. Pads on adjacent layers are brought into contact by pressure. The substrate for each layer may be a low dielectric material such as Teflon.

An interconnect mechanism is needed which offers: (1) a substantial increase in number of conductive layers; (2) electrical interconnection among several layers which is independent of the thickness of the assembly; (3) convenient repair and revision capability; (4) higher signal propagation velocities; and (5) greater control over signal routing.

SUMMARY OF THE INVENTION

It is, therefore, an object of the present invention to provide a multilayer pressure stack (microstack) having increased signal propagation velocities.

A further object of the present invention is to provide a microstack for a two-dimensional package having a plurality of layers (or wafers) formed of a material having a high time-dependent deformation factor and a plurality of segments in each layer formed of a conductive material having a low time-dependent deformation factor.

Another object of the present invention is to provide a microstack having signal layers formed of a relatively low dielectric constant material and ground wafers providing ground or voltage planes between alternate signal wafers to prevent cross-talk between x-y interconnects on alternate signal wafers.

Another object of the present invention is to provide a microstack having signal traces surrounded by dielectric materials including air, and a low dielectric constant signal layer to increase the signal propagation velocity.

Another object of the present invention is to provide a microstack in which a group of aligned segments form a column and in which interposers are provided in selected segments to interrupt, i.e., electrically isolate, portions of the columns.

Another object of the present invention is to selectively electrically interrupt the columns by providing interrupts formed of high time-dependent deformation factor materials which are encapsulated in the conductive segments.

Another object of the present invention is to provide a multilayer pressure stack in which the number of layers may exceed 100.

Another object of the present invention is to provide a multilayer pressure stack in which engineering changes may be accomplished by the substitution of layers.

The present invention relates to a multilayer pressure stack (microstack) including a plurality of layers, each layer being formed of a material having a high time-dependent deformation factor, a plurality of segments formed in each layer, each segment comprising a conductive material having a low time-dependent deformation factor, and pressurizing means for providing pressure along a column of aligned segments. Interposers are provided in selected segments of selected columns to electrically isolate (or interrupt) portions of the column.

The present invention also relates to a two-dimensional package for a plurality of semiconductor devices each having an array of contacts, including first and second semiconductor device support means for supporting first and second groups of the plurality of semiconductor devices so that the contacts of the first group of semiconductor devices face the contacts of the second group of semiconductor devices, multilayer pressure stack means for electrically interconnecting selected ones of the contacts of the first group of semiconductor devices with selected ones of the contacts of the second group of semiconductor devices, and pressurizing means for providing pressure along a column of aligned segments and contacts. An alternative embodiment of the two-dimensional package includes one semiconductor device support means and one group of semiconductor devices, with the second support means being replaced by a pressure plate.

DESCRIPTION OF THE PREFERRED EMBODIMENTS

A multilayer pressure stack (microstack) and a two-dimensional package utilizing a microstack in accordance with the present invention will be described with reference to FIGS. 1-7.

A microstack is a pressurized system for interconnecting electrical devices, where a plurality of signal and ground layers (wafers) are assembled into a stack and pressurized to establish electrical interconnections between the wafers. Each signal wafer has a desired pattern of conductors to provide interconnections in the x and y directions and segments in each wafer are connected under pressure to provide the wafer-to-wafer (z-axis) electrical interconnections. In the microstack of the present invention, each layer is fabricated using a low-dielectric-constant polymer, with front-to-back electrical connections affected by an array of segments.

The inventors have recognized that low dielectric constant polymers which are desirable for improving pulse propagation velocity are susceptible to high rates of strain when utilized in a pressurized system, and have a high time-dependent deformation factor. The deformation of a material which is placed under pressure is known as "creep." Materials having a high time-dependent deformation factor tend to deform (or "creep") when placed under pressure, whereas materials having a low time-dependent deformation factor are less likely to deform when placed under pressure. Thus, in a microstack in accordance with the invention, the segments in each wafer provide electrical interconnections as well as support for the mechanical load along a column of pressurized segments.

Figure 1:
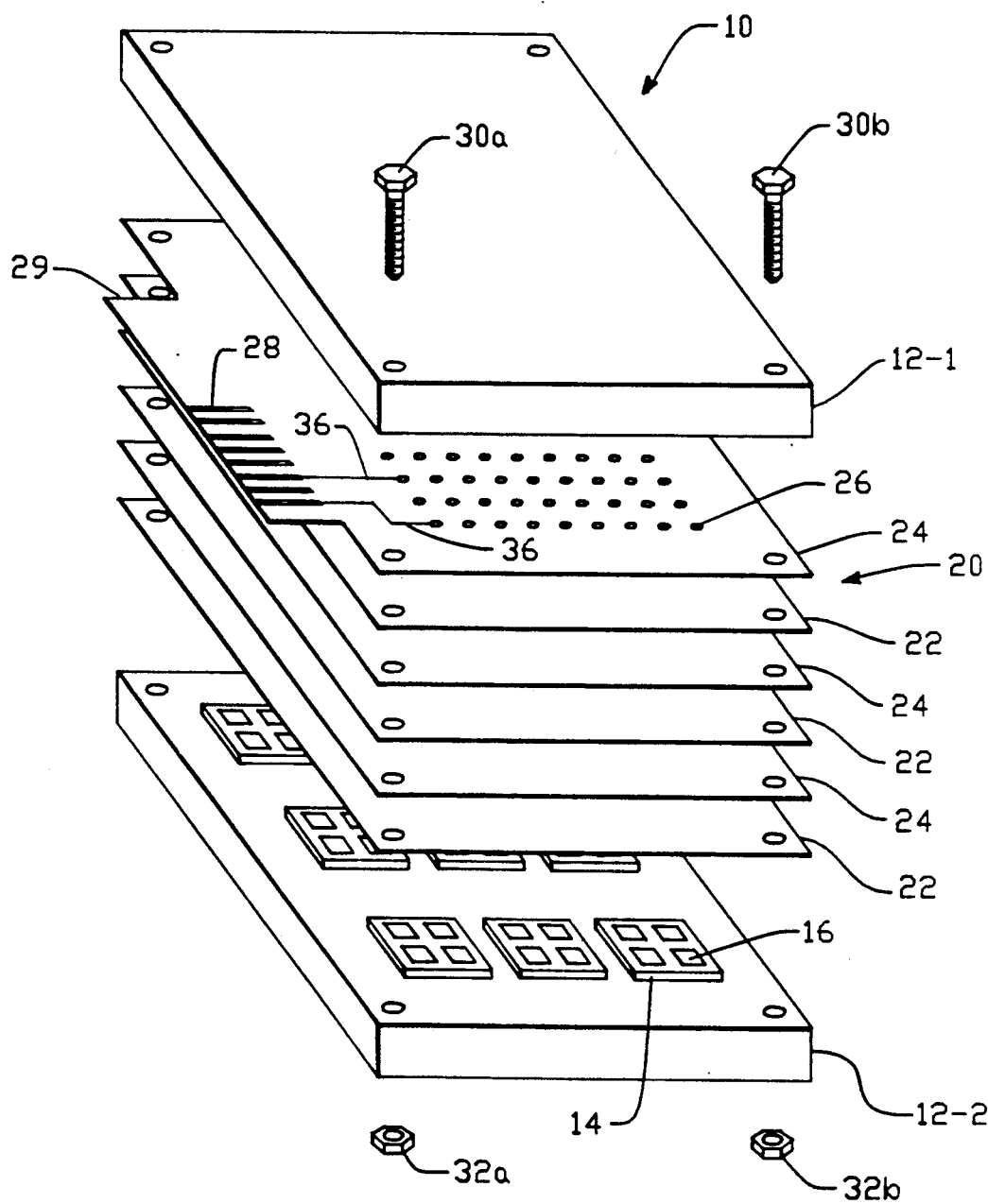
FIG. 1 is an isometric exploded view of a two-dimensional package in accordance with the present invention.

FIG. 1 illustrates a two-dimensional package 10 in accordance with the present invention. First and second pressure plates 12-1, 12-2 each support a plurality of semiconductor (or other electrical) devices 14 having a plurality of contacts 16 facing away from the pressure plates 12-1, 12-2. The contacts 16 of semiconductor devices 14 provided on respective ones of the first and second pressure plates 12-1, 12-2 are arranged to face each other. Alternatively, one pressure plate (e.g., pressure plate 12-2) may support all of the electrical devices 14 with the other pressure plate 12-1 performing other structural functions.

Figure 2:
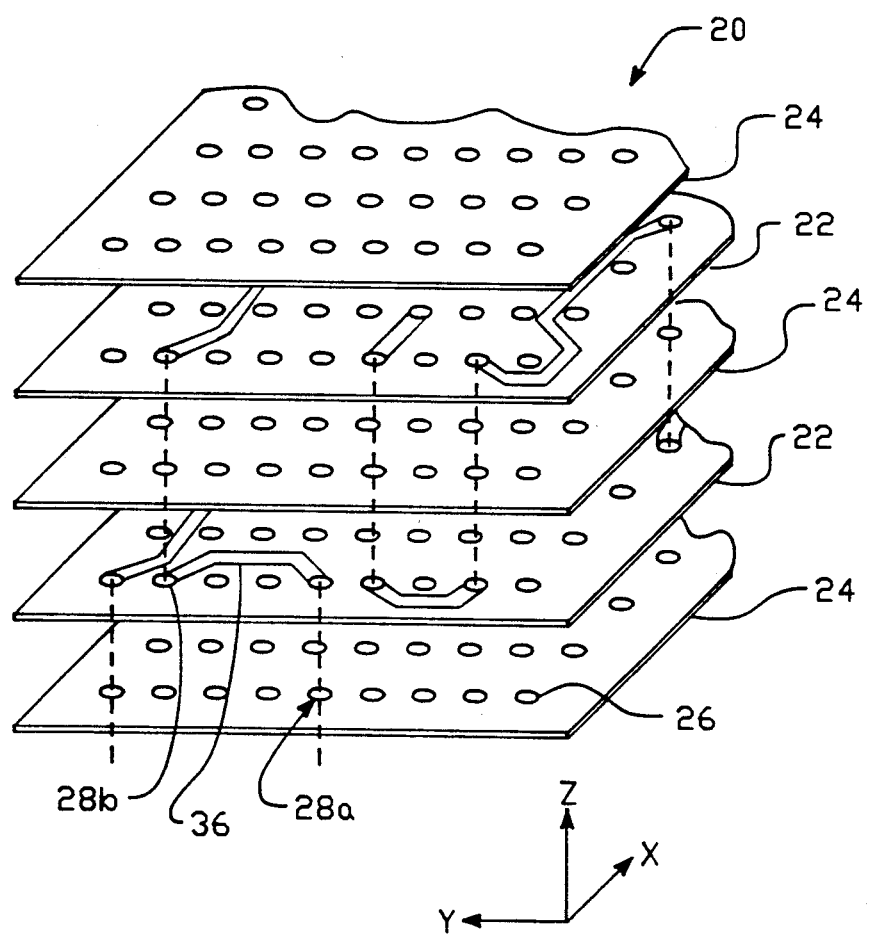
FIG. 2 is an isometric exploded view of the layers in a portion of a multilayer pressure stack.
Figure 3:
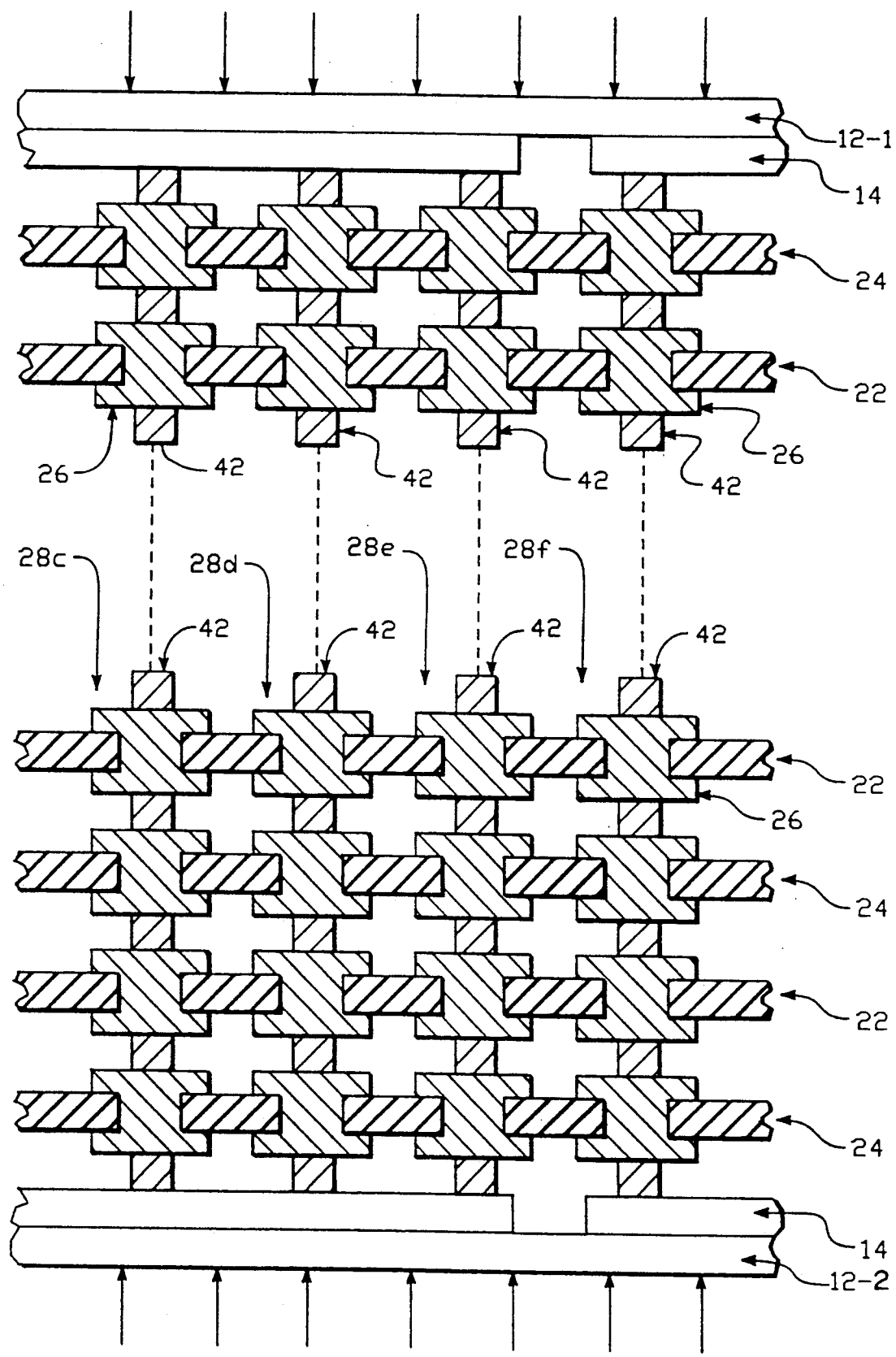
FIG. 3 is cross sectional view of a microstack.

A microstack 20 provides electrical interconnections between selected ones of the contacts 16 of semiconductor devices 14. The microstack 20 includes alternating signal wafers 22 and ground/voltage wafers 24. Each wafer 22, 24 has a plurality of segments 26 provided in an array so that aligned segments 26 in wafers 22, 24 form columns 28 (FIGS. 2 and 3). Each column 28 is made conductive by the application of pressure along the z-axis of the microstack. In particular, applying pressure to pressure plates 12-1, 12-2 pressurizes all of the columns 28. The means of providing pressure may be, for example, pressure bolts 30a, b, extending through the package 10 and tightened with nuts 32a, b to force pressure plates 12-1, 12-2 towards each other. Pressure bolts 30 may also pass through wafers 22, 24 to align the wafers 22, 24. Other pressurizing devices include external clamps (not shown) used in conjunction with an internal alignment mechanism. The density of columns 28 may be greater than 400 columns per square centimeter. Further, the number of wafers per microstack 20 may be as large as 100 wafers, providing flexibility in circuit routing as well as a large number of interconnections.

It is desired that the pressurizing device provide a constant pressure over a range of deformation or other movements of the microstack. One example of a device for providing constant pressure is belleville springs (not shown) provided on bolts 30. Electrical connections to external devices are provided on contact extensions 27 on selected ones of the signal and ground wafers 22, 24 utilizing, e.g., edge connectors 28. The signal and/or ground wafers 22, 24 having contact extensions 27 are referred to as voltage feed wafers.

FIG. 2 illustrates the manner in which signal wafers 22 provide signal paths extending in the x and y directions. For example, signal trace 36 is used to transfer a signal from first column 28a to second column 28b. Signal traces 36 also extend to edge connectors 28 to provide external electrical access to the microstack 20.

FIG. 3 is a cross-sectional view illustrating columns 28c-f each comprising a plurality of segments 26. In the embodiment illustrated in FIG. 3, segments 26 are one-piece segments. In the embodiment illustrated in FIG. 4, each segment 26 includes a via 38 and pads 40 provided at each end of via 38. An inter-wafer contact (or bump) 42 is provided between pads 40 of segments 26 on adjacent wafers 22, 24. Bumps 42 may be provided only at one end of each segment 26, with the bumps 42 on the segments in one layer 22, 24 contacting the bumpless end of a segment 26 in an adjacent layer 22, 24. In this embodiment, the layer 22, 24 at the top or bottom of the microstack 20 has bumps 42 provided at both ends of segments 26. In another embodiment of the invention, bumps 42 are provided at both ends of each segment 26, and the contact between layers 22, 24 is a bump-to-bump contact.

Bumps 42 are designed to deform under pressure. This deformation, which causes bumps 42 to assume a "barrel-like" shape, assures that all columns 28 will have substantially equal lengths, thereby avoiding open circuits which could be caused by air gaps between bumps 42 (or between a bump 42 and a segment 26) if one segment 26 or bump 42 were longer than the other segment 26 or bump 42 on a wafer. Further, bumps 42 may be formed of a material, e.g., gold or a gold alloy, which is more malleable than segments 26 to assure that bumps 42 rather than segments 26 will deform under pressure. Another purpose of bump deformation is to provide an increased contact surface area as the bumps 42 "flow" under pressure.

Preliminary testing of microstacks fabricated in accordance with the present invention indicates that pressurization of the microstack should be a multi-step process including at least one short-term conditioning stage. The final pressure for a microstack must be empirically determined and varies in accordance with factors including the number of layers and the hardness of bumps 42. During assembly, the microstack is subjected to an overpressurization to cause bumps 42 to flow and set. The pressure is then decreased (in some cases removed) prior to establishing the operating pressure for the microstack 20.

The preliminary testing also indicates that the pressure versus resistance (or inversely, conductance) curve shows a hysteresis: during pressurization, resistance initially decreases rapidly as pressure increases. As the pressure reaches a first threshold, the rate of the decrease in resistance falls, and at a second threshold resistance ceases to decrease as pressure increases. During depressurization, the resistance versus pressure curve tracks the same curve developed during pressurization until reaching a depressurization threshold between the first and second thresholds; at the depressurization threshold, the resistance suddenly increases dramatically due to the physical separation of the segments forming a column. Based on this relationship of pressure and resistance, the pressurization of a microstack is performed as follows. First, a stack setting is performed in which pressure is increased until the second threshold is reached. Then, pressure is decreased to the final pressure which is as close to the depressurization threshold as possible. Stack setting typically involves a series of pressurizations to deform the bumps to the point where all columns 28 have the same length and the resistance versus pressure curve reaches the second threshold.

One method of fabricating pads 40 is to provide a conductive layer on the entire surface of signal wafer 22 and then to remove the unwanted portions of the conductive layer by etching so that pads 40 remain (subtractive processing). If pads 40 are formed using this process, signal traces 36 can be fabricated concurrently with fabrication of pads 40.

Another method of fabricating pads 40 is an additive process which provides better interposer placement and containment. Additive processing is useful to produce the ground wafers 24 illustrated in FIG. 4 and described below.

Figure 4:
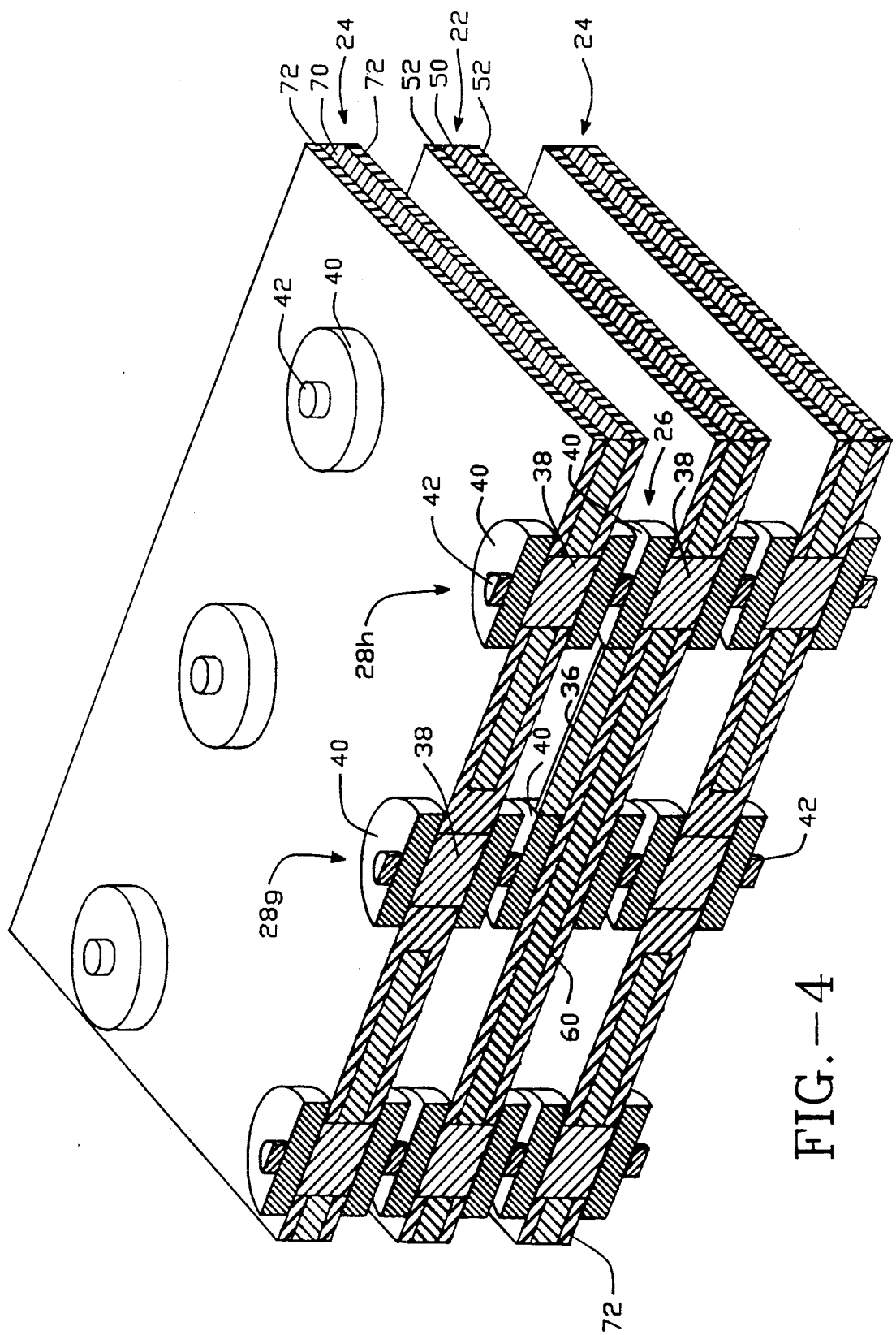
FIG. 4 is an isometric, partial cross-sectional view of a microstack in accordance with the present invention for describing the signal and ground wafers.

FIG. 4 is an isometric, partial cross-sectional view of a portion of a microstack 20 useful for describing the structure of layers 22, 24 and segments 26. FIG. 4 is also useful for describing the manner in which the structure of a microstack 20 in accordance with the present invention provides improved electrical properties over the existing two-dimensional packages. The inventors of the present invention, taking into account the fact that the dielectric constant of a non-conductive material which surrounds or supports a conductor is related to the propagation velocity of a signal traveling in the conductor, have designed signal layers 22 of a low-dielectric constant material. Examples of signal propagation velocities are as follows: ceramics have a dielectric constant $\delta$ of approximately 10 and provide propagation velocities of approximately 31% of the speed of light c; for printed circuit (PC) boards $\delta$ is approximately 5 and the propagation velocities for signals traveling in printed circuit boards is approximately 50-60% of c. Propagation velocity is related to $1/\sqrt{\delta}$. The highest signal propagation velocities are provided by using air ($\delta=1$) to electrically insulate the conductor.

Materials which have a low dielectric constant and which are desirable as supports or insulators for a conductor tend to have a high time-dependent deformation factor. One example of a material having a low dielectric constant is polytetrafluoroethylene (PTFE), e.g., Teflon ($\delta=2.1$).

In the microstack 20 of the present invention, layers which have a small dielectric constant and a high time-dependent deformation factor are combined with conductive segments 26 having a low time-dependent deformation factor in a structure in which the segments 26 are pressurized and bear the mechanical load so that the microstack 20 does not creep. One example of a low dielectric constant, low time-dependent deformation factor structure is a signal wafer 22 which includes a core 50 and at least one dielectric layer 52 provided on core 50; alternatively, dielectric layers 52 may be provided on both surfaces of core 50. Core 50 is formed of a material, e.g., a polyimide such as Kapton, which provides a semi-rigid structure. polyimides are a class of plastics which are resistant to high temperature, wear, radiation, and many chemicals. Dielectric layers 52 are formed of the lowest dielectric constant material practical, for example, a PTFE such as Teflon.

Segments 26 extend through the signal wafer 22 and signal traces 36 formed on dielectric layer 52 provide electrical interconnections between selected columns, e.g., columns 28g and 28h. Signal traces 36 have characteristics of a microstrip, and the combination of a dielectric layer 52 formed of Teflon and the air surrounding the remaining portion of signal trace 36 provide an effective (or composite) dielectric constant of $\delta=1.3-1.7$. This low dielectric constant coupled with the provision of ground or voltage planes on either side of each signal trace provide signal propagation velocities greater than 75% of c, a low loss transmission medium, a low signal rise time, and the ability to support large bandwidths. With optimum materials and conditions, it is expected that signal propagation velocities of 85-90% of c can be achieved.

As shown in FIG. 4, ground wafers 24 include a conductive core 70 and an insulative or dielectric layers 72. Core 70 may be formed of copper or other conductors such as aluminum or gold or compounds of these materials, and dielectric layer 72 may be formed of a polyimide such as Kapton. The core 70 may be maintained at ground potential or at a selected voltage. Moreover, the cores, 70 of different ground layers 24 may be maintained at different voltages. Core 70 is electrically interconnected with selected columns 28 through contact with vias 38 in the selected column, e.g., column 28h. Column 28g is electrically insulated from cores or ground planes 70 in ground wafers 24. By providing ground or voltage planes, i.e., cores 70, on each side of a signal wafer 22, interference between the signals traveling in signal traces 36 on respective signal wafers 22 is avoided.

Figure 5:
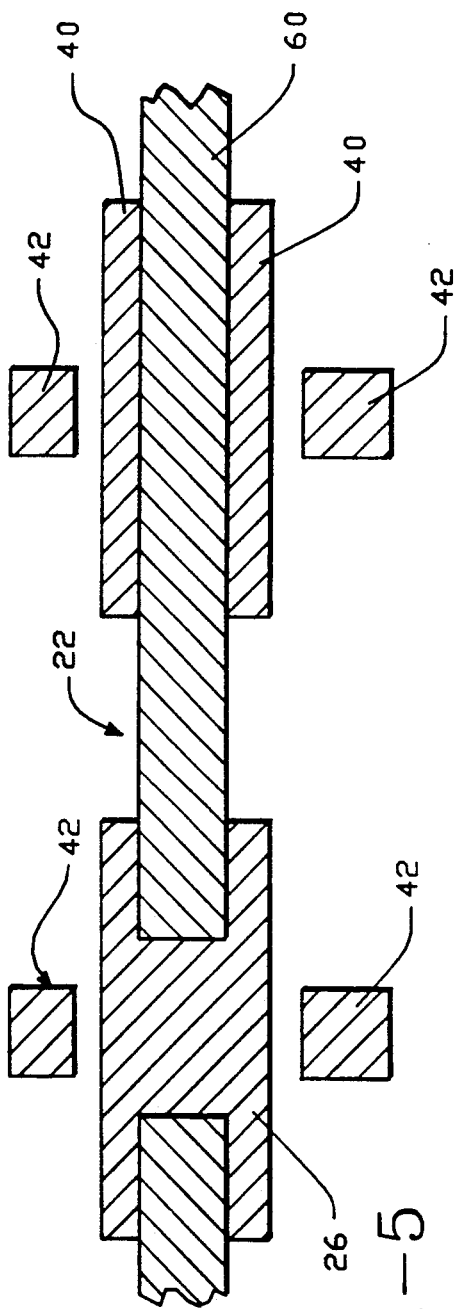
FIG. 5 is a cross-sectional view of a wafer showing a first type of interposer provided therein.
Figure 6:
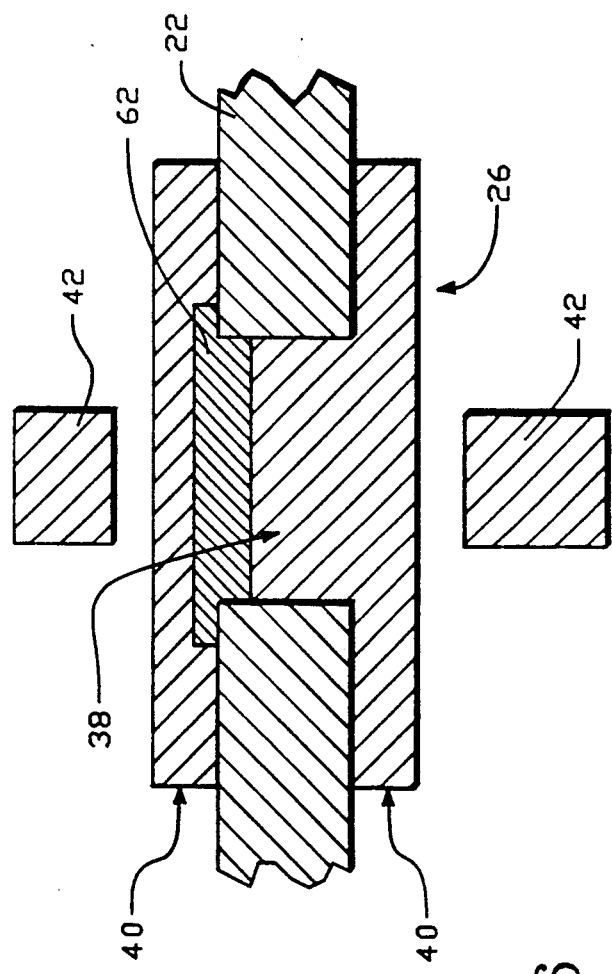
FIG. 6 is a cross-sectional view of a wafer showing a second type of interposer.

It is desirable to provide selected points of electrical insulation, interrupts, in one or more pressure columns 28. FIGS. 5 and 6 illustrate two methods of providing the selective insulation. A first embodiment of an interrupt comprises an interposer 60 (FIG. 5) formed by signal wafer 22; in particular, via 40 is eliminated from the segment 26 so that the insulative material of signal wafer 22 is provided between pad 40. A second embodiment of an interrupt (FIG. 6) comprises an interposer 62 formed as part of a segment 26.

The interrupt 60 shown in FIG. 5 is more susceptible to time-dependent deformation, but in applications where mechanical loads are relatively low interrupt 60 is attractive because of its ease of manufacture. The interrupt shown in FIG. 6 is more difficult to manufacture but is more tolerant of high pressure levels because materials having larger time-dependent deformation factors may be used and they may be constrained from deformation by encapsulation in the metal segment 26. This interrupt comprises an interposer 62 formed of a dielectric material, such as glass-reinforced polyimide or a ceramic, which is encapsulated in a segment 26. Other materials may be used to form interposer 62, provided that such materials are creep resistant, i.e., have a low time-dependent deformation factor.

Figure 7:
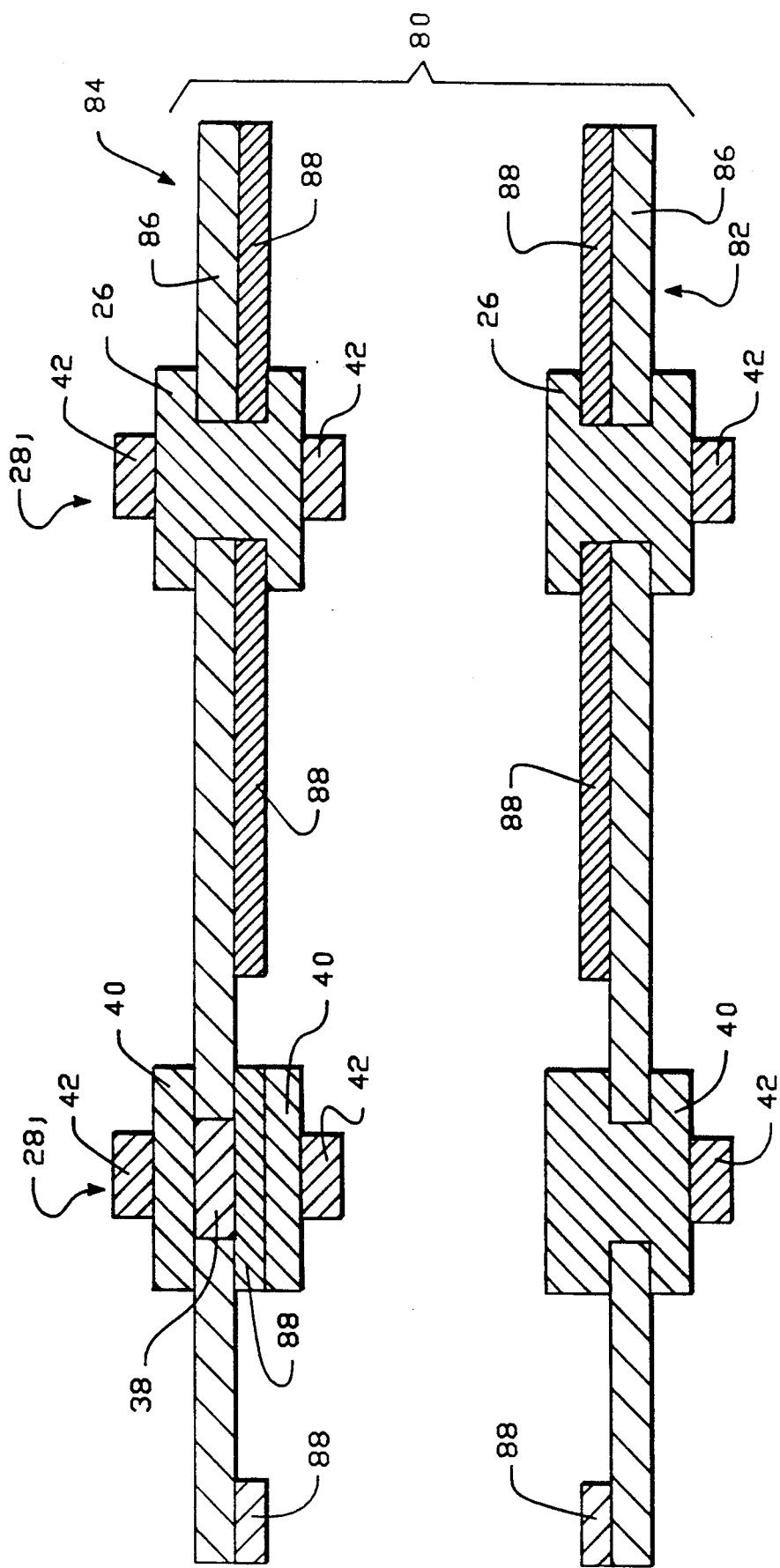
FIG. 7 is a cross-sectional view of a split ground wafer.

FIG. 7 illustrates an alternative to ground wafers 24 in a split ground wafer 80. The split ground wafer comprises first and second wafers 82, 84 each having a support layer 86 and a conductive layer 88 which form a ground or voltage plane. The advantage of a split ground wafer 80 is in ease of manufacture since it is not required to sandwich a conductive core between two dielectric layers as in ground wafer 24. Support layers 86 may be formed of the same material as dielectric layer 72 and layer 50 of signal wafer 22. As with ground wafers 24, selected columns, e.g., column 28j, may be electrically insulated from ground planes 88 by discontinuing the ground planes in the region of the column.

In a microstack in accordance with the present invention, segments 26 may be provided on a 0.5 mm matrix with the total wafer thickness ranging from 75-175 microns. The diameter and height to bumps 42 may range from 50 to 70 microns, with pads 40 having a correspondingly larger diameter. The diameter of vias 37 may range from approximately 0.1 mm to approximately 0.3 mm. Selected signal and ground wafers have portions which extend out of the microstack to provide external electrical connections.

Engineering changes can be made by replacing one or more signal wafers 22—it is contemplated that the ground wafers 24 on each side of the signal wafer 22 would also be replaced—and repressurizing the microstack 20.

The many features and advantages of the microstack and of two-dimensional packages including a microstack in accordance with the present invention will be apparent to those skilled in the art from the description of the preferred embodiments. Thus, the following claims are intended to cover all modifications and equivalents falling within the scope of the invention.

What is claimed is:

1. A multilayer pressure stack, (microstack), comprising:
   a plurality of layers, each layer comprising a core having first and second surfaces and dielectric layers formed of a material having a high time-dependent deformation factor and provided on said first and second surfaces of said core;
   a plurality of segments formed at selected locations in each layer so that each said layer has a segment at each of said selected locations, each segment being formed of a conductive material having a low time-dependent deformation factor and comprising a via provided in the layer and first and second pads overlying said via and corresponding ones of said dielectric layers;
   a plurality of bumps provided on selected pads so that one bump is associated with pads of corresponding segments of adjacent ones of said plurality of layers; and
   means for aligning said layers so that said segments and bumps form columns and for releasably pressurizing one of said columns.

2. A microstack according to claim 1, further comprising interposers formed of non-conductive material provided in selected segments.

3. A microstack according to claim 2, wherein said plurality of layers comprises signal wafers and ground wafers.

4. A microstack according to claim 3, wherein said core of each said ground wafer comprises a conductive material.

5. A microstack according to claim 3, wherein said core each of said signal wafers comprises a polyamide, and said first and second dielectric layers comprise polytetrafluoroethylene (PTFE).

6. A microstack according to claim 5, wherein:
   selected ones of said signal wafers comprise at least one signal trace provided on one of said PTFE layers electrically interconnecting selected segments; and
   said signal traces and said columns have a signal propagation velocity greater than 75% of the speed of light.

7. A microstack according to claim 3, further comprising bumps provided on said segments, wherein electrical contact between said segments is provided by said bumps and said means for aligning and releasably pressurizing slightlyd eforms said bumps to provide planarization of the contacts between adjacent wafers.

8. A microstack according to claim 7, wherein said columns have substantially equal lengths, the lengths being the sum of the lengths of the segments and bumps in each column.

9. A microstack according to claim 2, wherein said plurality of layers comprises signal wafers, ground wafers, and voltage feed wafers.

10. A microstack according to claim 9, wherein each of said layer has a plane, said columns provide interconnections along a z-axis normal to said planes of said layers, and said signal wafers provide electrical interconnections between said columns in planes parallel to said planes of said layers.

11. A microstack according to claim 9, further comprising signal traces provided on said signal wafers, said signal traces being electrically insulated by dielectric materials, including one of said dielectric layers, having a composite dielectric constant of less than 2.

12. A microstack according to claim 11, wherein said core of each said ground wafer comprises a conductive material and said conductive ground planes are electrically isolated from selected ones of said segment.

13. A microstack according to claim 1, wherein selected segments comprise a section formed of non-conductive material and electrically interrupt said columns in which the selected segments are provided.

14. A microstack according to claim 1, wherein selected ones of said segments further comprise interrupts.

15. A microstack according to claim 14, wherein said interrupts comprise a non-conductive material substantially encapsulated in said selected segments.

16. A two-dimensional package for a plurality of semiconductor devices each having an array of contacts, comprising:
   first and second semiconductor device support means for supporting first and second groups of the plurality of semiconductor devices so that the contacts of the first group of semiconductor devices face the contacts of the second group of semiconductor devices;
   multilayer pressure stack means for electrically interconnecting selected ones of the contacts of the first group of semiconductor devices with selected ones of the contacts of the second group of semiconductor devices, comprising:
      a plurality of replaceable layers, each layer having first and second surfaces and comprising a core and a dielectric layer formed of a material ahving a high time-dependent deformation factor,
      a plurality of segments formed at selected locations in each layer so that each layer has a segment at each of said selected locations, each segment being formed of a conductive material having a low time-dependent deformation factor and comprising a via provided in the layer and first and second pads overlying the via and corresponding ones of the first and second surfaces of the layer,
      a plurality of bumps provided on selected pads so that one bump is associated with pads of corresponding segments of adjacent ones of said plurality of layers, and
      interposers formed of non-conductive material provided in selected segments; and
   means for aligning said layers so that said segments and said bumps form columns and for releasably pressurizing said columns.

17. A two-dimensional package according to claim 16, wherein said interposers are encapsulated in the conductive material of said segments.

18. A two-dimensional package according to claim 17, wherein said interposers comprise a mateirl having a low time-dependent deformation factor.

19. A two-dimensional package according to claim 16, further comprising signal traces provided on selected dielectric layers and electrically interconnecting selected segments, wherein the effective dielectric constant of the dielectric materials insulating said signal traces is less than 2.

20. A two-dimensional package for a plurality of semiconductor devices each having an array of contacts, comprising:

first means for supporting the semiconductor devices;

second means for electrically interconnecting selected ones of the contacts of the semiconductor devices, comprising:

a plurality of at least fifty replaceable layers, each replaceable layer having first and second surfaces and comprising a core and a dielectric layer formed of a material having a high time-dependent deformation factor, a plurality of segments formed at selected locations in each layer so that each layer has a segment at each of said selected locations, said selected locations corresponding to the positions of respective ones of the contacts of the semiconductor devices, each segment being formed of a conductive material having a low time-dependent deformation factor and comprising a via provided in the layer and first and second pads overlying the vias and respective ones of the first and second surfaces of the replaceable layer, a pluraltiy of bumps provided on selected pads so that one bump is associated with pads of corresponding segments of adjacent ones of said plurality of layers, and signal traces provided on selected layers for providing electrical interconnections between selected ones of said segments, and interposers formed of non-conductive material provided in selected segments; and means for aligning said layes so that said segments form columns and for releasably pressurizing said columns of aligned segments and corresponding ones of the contact of the semiconductor devices so that selected ones of said layers may be replaced.

21. A two-dimensional package according to claim 20, wherein said interposers comprise a material having a low time-dependent deformation factor.

22. A two-dimensional package according to claim 20, further comprising signal traces provided on selected signal layes and electrically interconnecting selected segments, wherein the effective dielectric constant of the dielectric materials insulating said signal traces is less than 2.

23. A multilayer pressurized interconnection assembly comprising:

a plurality of signal wafers, each signal wafer comprising a semi-rigid core and a dielectric layer formed of a material having a high time-dependent deformation factor;

signal traces provided on said signal wafers, each said signal trace being surrounded and electrically insulated by dielectric material having a composite dielectric constant of less than 2;

a plurality of ground wafers provided between respective ones of said signal wafers, each said gruond wafer comprising a conductive core and first and second dielectric layers formed of a material having a high time-dependent deformation factor and provided on each side of the conductive core;

a plurality of segments formed at selected locations in each said signal and each said ground wafer so that each signal wafer and each ground wafer has a segment at each of said selected locations, each segment comprising a conductive material having a low time-dependent deformation factor;

interrupt means for selectively, electrically interrupting said segments; and means for aligning said layers so that said segments form columns, each column having a longitudinal axis, and for releasably pressurizing said columns of aligned segments to allow said microstack to be disassembled and reassembled for replacement of selected ones of said signal wafers.

24. A two-dimensional according to claim 23, wherein said interrupt means comprise interposers encapsulated in selected segments.

25. A two-dimensional according to claim 23, wherein said signal wafers comprise pllytetrafluoroethylene PTFE and said dielectric comprsies PTFE and air.

26. A two-dimensional according to claim 25, wherein the signal propagation veloctiy is greater than 75% of the speed of light.

* * * * *